(12) United States Patent  (10) Patent No.: US 7,221,568 B2
Hung et al.  (45) Date of Patent: May 22, 2007

(54) HEAT DISSIPATING MODULE WITH ENGAGING ASSEMBLY

(75) Inventors: Chun-Yang Hung, Taoyuan Hsien (TW); Yu-Hung Huang, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 211 days.

(21) Appl. No.: 11/111,806

(22) Filed: Apr. 22, 2005

(65) Prior Publication Data

US 2006/0187637 A1  Aug. 24, 2006

(30) Foreign Application Priority Data

Feb. 21, 2005  (TW) .............................. 94105033 A (51) Int. Cl.
*H05K 7/20* (2006.01)
(52) U.S. Cl. .................................... 361/697
(58) Field of Classification Search ................ 361/697, 361/695, 694, 702, 704; 439/487; 165/80.3, 165/119
See application file for complete search history.

(56) References Cited

U.S. PATENT DOCUMENTS 5,943,210 A * 8/1999 Lee et al. ................... 361/697
7,031,157 B2 * 4/2006 Horng et al. ............... 361/695
7,126,824 B2 * 10/2006 Lee et al. .................... 361/704
7,133,288 B2 * 11/2006 DelPrete et al. ............ 361/719
7,150,311 B2 * 12/2006 Liu ............................ 165/80.3
2006/0021733 A1 * 2/2006 Huang ....................... 165/80.3

* cited by examiner

*Primary Examiner*—Chandrika Prasad
(74) *Attorney, Agent, or Firm*—Birch, Stewart, Kolasch & Birch, LLP (57) ABSTRACT

A heat dissipating module. A frame accommodates a fan. An engaging assembly is coupled to the frame and includes an engaging body, a tongue, a resilient element, a wrench bar, and a connecting element. The engaging body includes a hollow portion and at least one first pivot hole. The tongue includes a bent portion and a bottom engaging portion. The bent portion includes at least one second pivot hole and is slidably engaged in the hollow portion. The resilient element fits on the tongue and is interposed between the engaging body and the bottom engaging portion of the tongue. The wrench bar abuts the surface of the engaging body and includes at least one third pivot hole. The connecting element fits in the first, second, and third pivot holes and is disposed in the engaging body, pivoting the tongue and wrench bar to the engaging body.

22 Claims, 7 Drawing Sheets

HEAT DISSIPATING MODULE WITH ENGAGING ASSEMBLY

BACKGROUND

The invention relates to an engaging assembly, and in particular to an engaging assembly for a heat dissipating module.

Taiwan Patent No. 511733 discloses a conventional heat dissipating module, with a heat sink inlaid in a base thereof. A fan is disposed on a frame fixed to the base. The heat sink is interposed between the frame and the base, such that the fan is disposed on the heat sink to dissipate heat from the heat sink.

In the aforementioned heat dissipating module, the frame is fixed to the base by engagement, wedging, or a screwdriver, causing difficulties in assembly of the frame and base. Moreover, as the frame cannot be tightly fixed to the base by the aforementioned assemblies, vibration of the entire heat dissipating module occurs during operation of the fan thereof. Specifically, after the heat dissipating module operates for a long time, the connection between the frame and the base may be distorted, deformed, or broken. Additionally, a clamping member is often assembled to or disassembled from the heat dissipating module by a screwdriver, easily causing damage to peripheral electronic components disposed near the heat dissipating module. Accordingly, material costs and equipment for manufacturing the heat dissipating module may be increased, and applicability of the heat dissipating module may relatively be reduced.

Hence, there is a need for a better heat dissipating module and an engaging assembly thereof. The engaging assembly can be easily applied to a heat sink and a base accommodating a microprocessor.

SUMMARY

Accordingly, an exemplary embodiment of the invention provides a heat dissipating module comprising a frame and an engaging assembly. The frame accommodates a fan. The engaging assembly is coupled to the frame and comprises an engaging body, a tongue, a resilient element, a wrench bar, and a connecting element. The engaging body comprises a hollow portion and at least one first pivot hole. The tongue comprises a bent portion and a bottom engaging portion. The bent portion comprises at least one second pivot hole and is slidably engaged in the hollow portion. The resilient element fits on the tongue and is interposed between the engaging body and the bottom engaging portion of the tongue. The wrench bar abuts the surface of the engaging body and comprises at least one third pivot hole. The connecting element fits in the first, second, and third pivot holes and is fixed to the engaging body, pivoting the tongue and the wrench bar to the engaging body.

In an embodiment of the heat dissipating module, the engaging body further comprises at least one engaging plate by which the engaging body is fixed to a heat sink. The frame may be integrally formed with the engaging assembly, or coupled to the engaging assembly by an engaging device. The hollow portion is formed by a plurality of sidewalls, and at least one sidewall thereof comprises a sloped surface, allowing the bent portion to be slidably engaged in the hollow portion. When the wrench bar is rotated toward a first direction, the bent portion bends to allow the bottom engaging portion to tightly engage a base accommodating a microprocessor. When the wrench bar is rotated toward a second direction, the bent portion straightens to disengage the bottom engaging portion from the base.

Accordingly, the engaging assembly of an embodiment of the invention can be easily assembled to a heat sink and a base used for accommodating a microprocessor by simply pushing or turning the wrench bar. Moreover, the engaging assembly can be applied to various heat sinks and microprocessors, thereby providing enhanced applicability.

DESCRIPTION OF THE DRAWINGS

The invention can be more fully understood by reading the subsequent detailed description and examples with references made to the accompanying drawings, wherein:

FIG. 1b is a schematic cross section of a hollow portion of FIG. 1a;

DETAILED DESCRIPTION

FIGS. 1a, 1b, 2, and 3a–3d are directed to the structure and assembly of the engaging assembly of an embodiment of the invention.

Figure 1A:
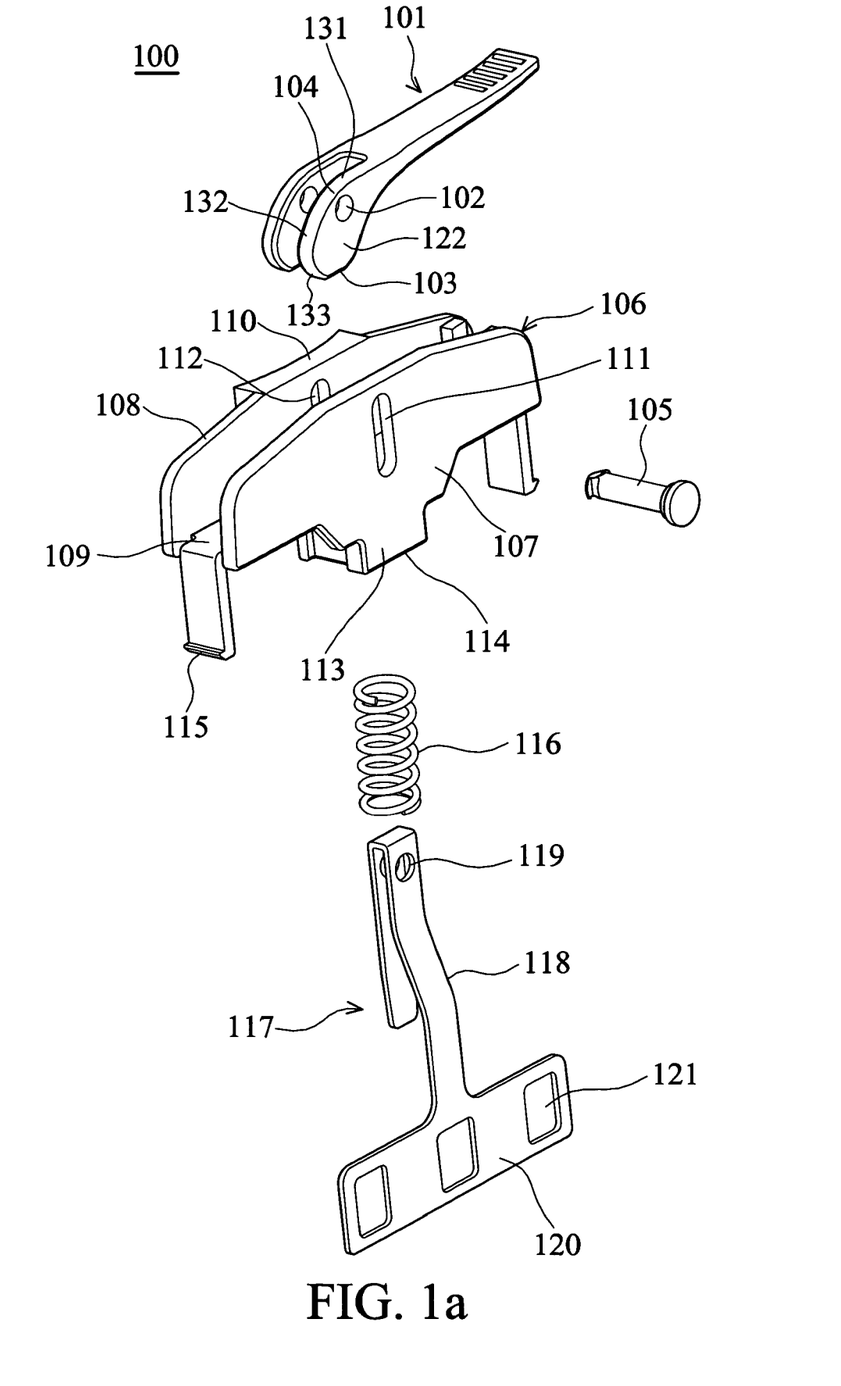
FIG. 1a is a perspective exploded view of the engaging assembly of an embodiment of the invention.
Figure 1B:
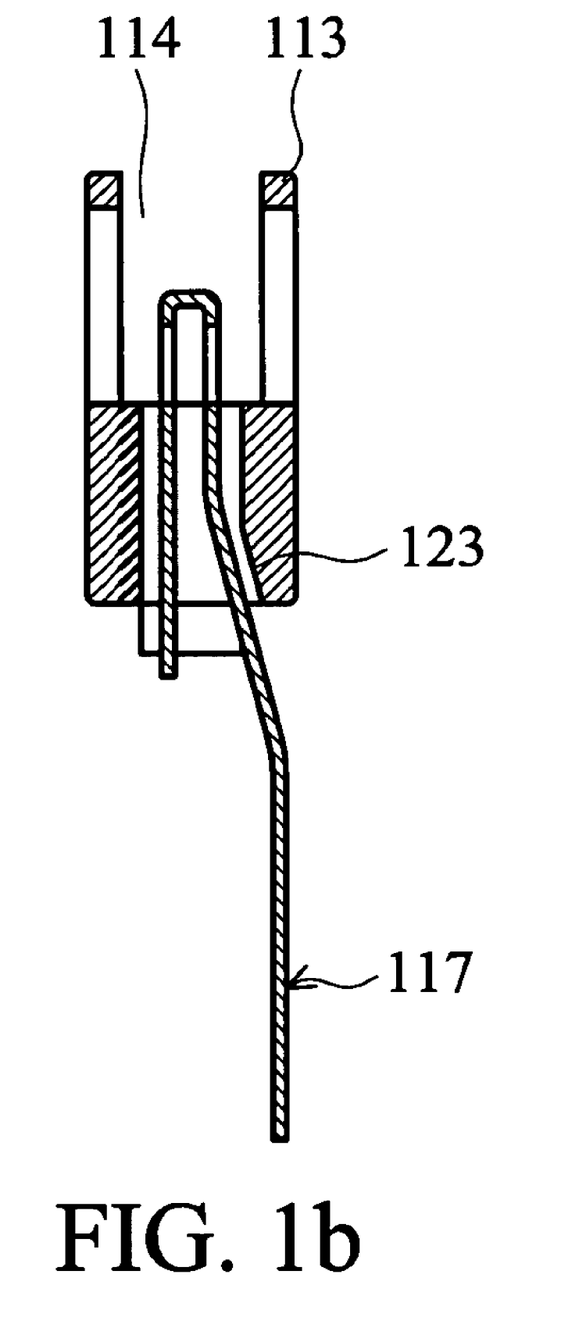

As shown in FIG. 1a, the engaging assembly 100 comprises a wrench bar 101, an engaging body 106, a resilient element 116, and a tongue 117. The engaging body 106 comprises two sides 107, 108 and a bottom surface 109. An engaging device 110 and a fourth pivot hole 112 are formed in the side 108. A first pivot hole 111 corresponding to the fourth pivot hole 112 is formed in the side 107. The engaging device 110 can engage a frame (not shown in FIG. 1a). The engaging body 106 further comprises two engaging plates 115 for engaging a heat sink (not shown in FIG. 1a). An extension 113 is disposed under and connected to the bottom surface 109. A hollow portion 114 is formed in the extension 113. As shown in FIG. 1b, the hollow portion 114 is formed by four sidewalls, at least one sidewall thereof having a sloped surface 123.

As shown in FIG. 1a, the tongue 117 comprises a bent portion 118 and a bottom engaging portion 120. The bent portion 118 can be a metal sheet with multiple bent parts corresponding to the sloped surface 123 in the hollow portion 114. The bent portion 118 is slidably engaged in the hollow portion 114 and comprises two second pivot holes 119. The bottom engaging portion 120 comprises a plurality of engaging holes 121 to engage a base (not shown in FIG. 1a) used for accommodating a microprocessor (not shown in FIG. 1a). The resilient element 116 fits on the tongue 117 and is interposed between the hollow portion 114 and the bottom engaging portion 120, bending or straightening the bent portion 118.

The wrench bar 101 comprises two third pivot holes 102 and two abutting portions 122. Each abutting portion 122 comprises a planar surface 103 and a curved surface 104. In this embodiment, the wrench bar 101 is disposed between the sides 107 and 108. The engaging body 106, tongue 117, and wrench bar 101 are combined together by a connecting element 105 fitting in the third pivot holes 102, first pivot hole 111, fourth pivot hole 112, and second pivot holes 119. Specifically, the caliber of the first pivot hole 111 (fourth pivot hole 112) must exceed that of the second pivot holes 119 and third pivot holes 102, such that the connecting element 105 can slide in the first pivot hole 111.

Figure 2:
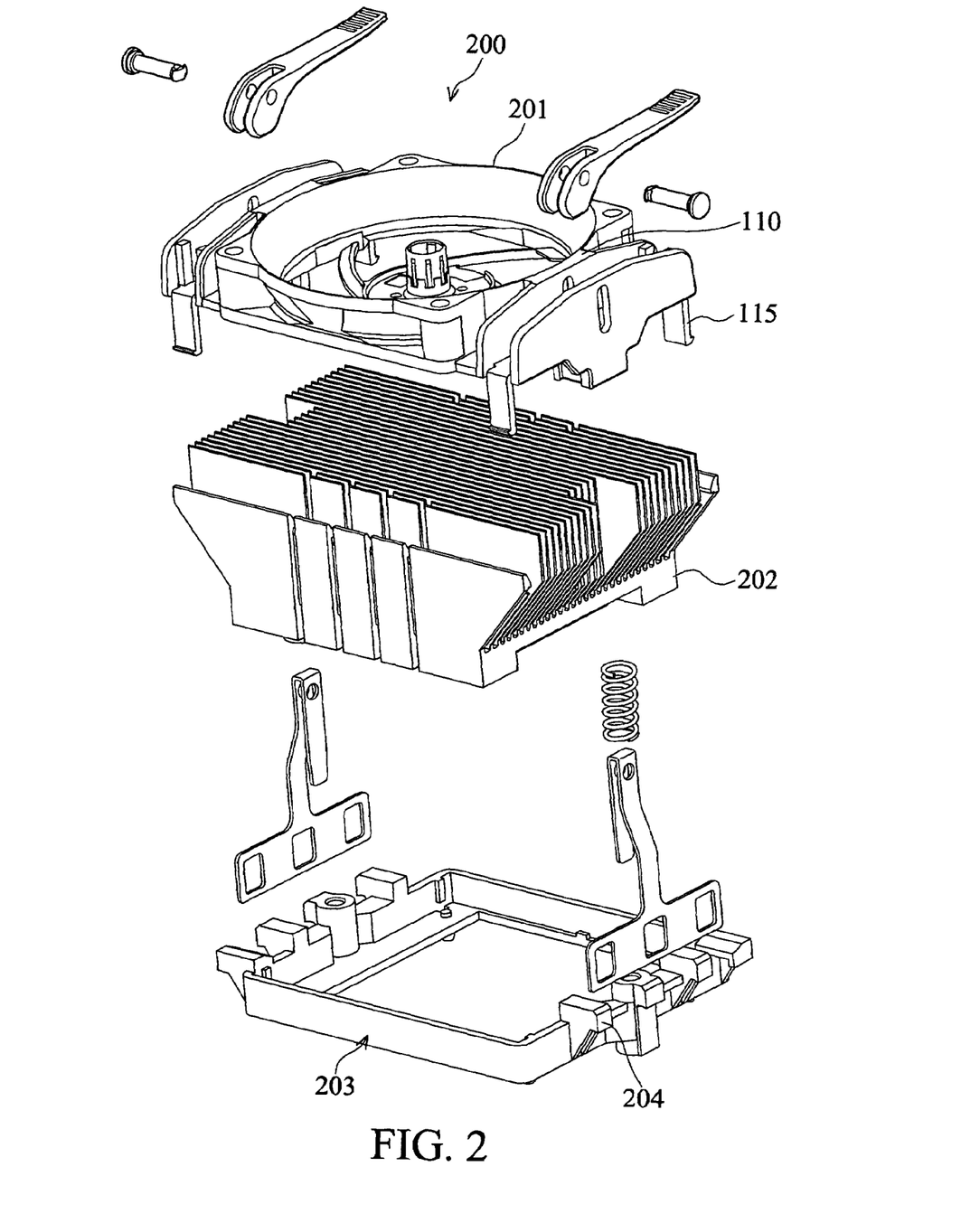
FIG. 2 is a perspective exploded view of the heat dissipating module of an embodiment of the invention.
Figure 3A:
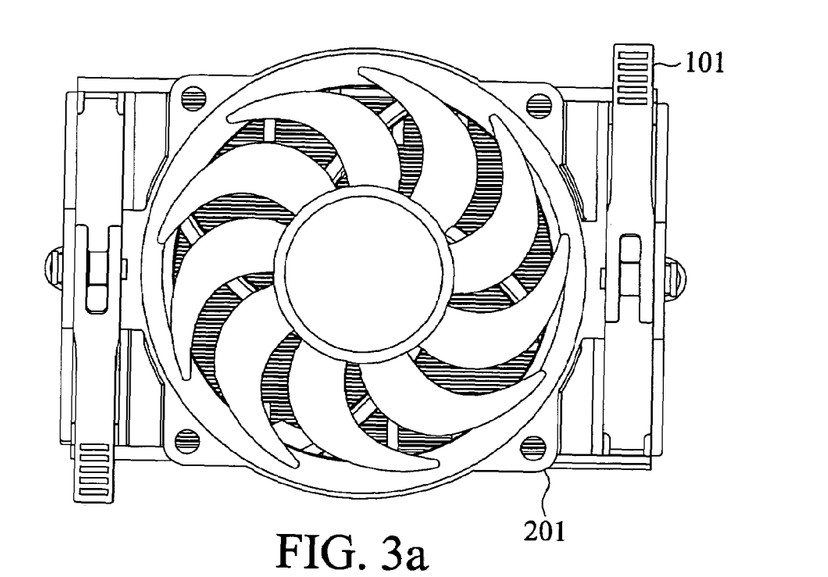
FIG. 3a is a schematic top view of the heat dissipating module of an embodiment of the invention.
Figure 3B:
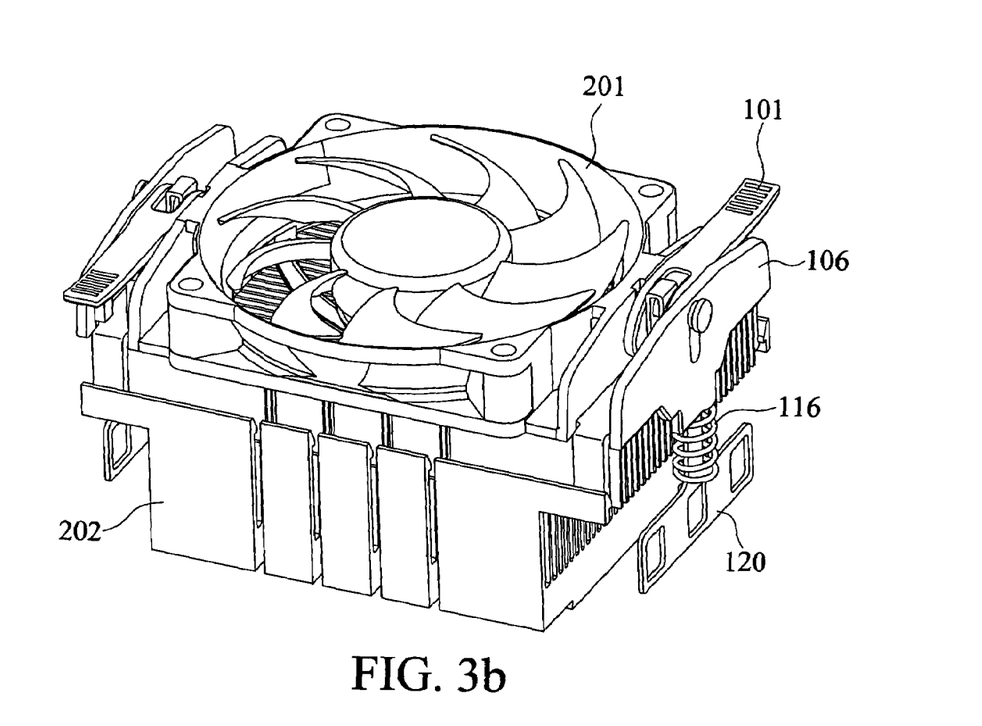
FIG. 3b is a schematic perspective view of the heat dissipating module of an embodiment of the invention.
Figure 3C:
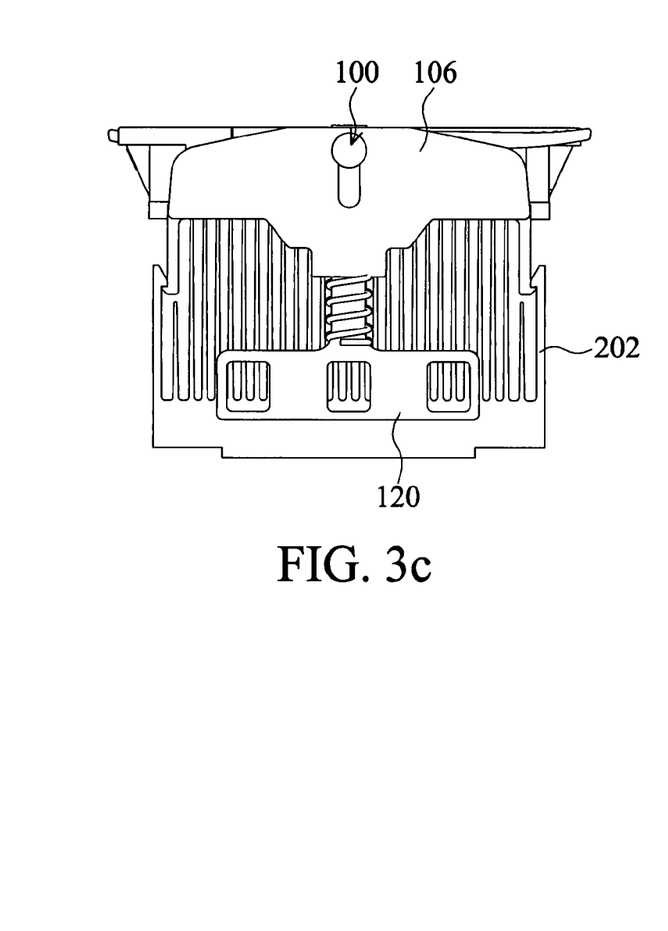
FIG. 3c is a schematic side view of the heat dissipating module of an embodiment of the invention.
Figure 3D:
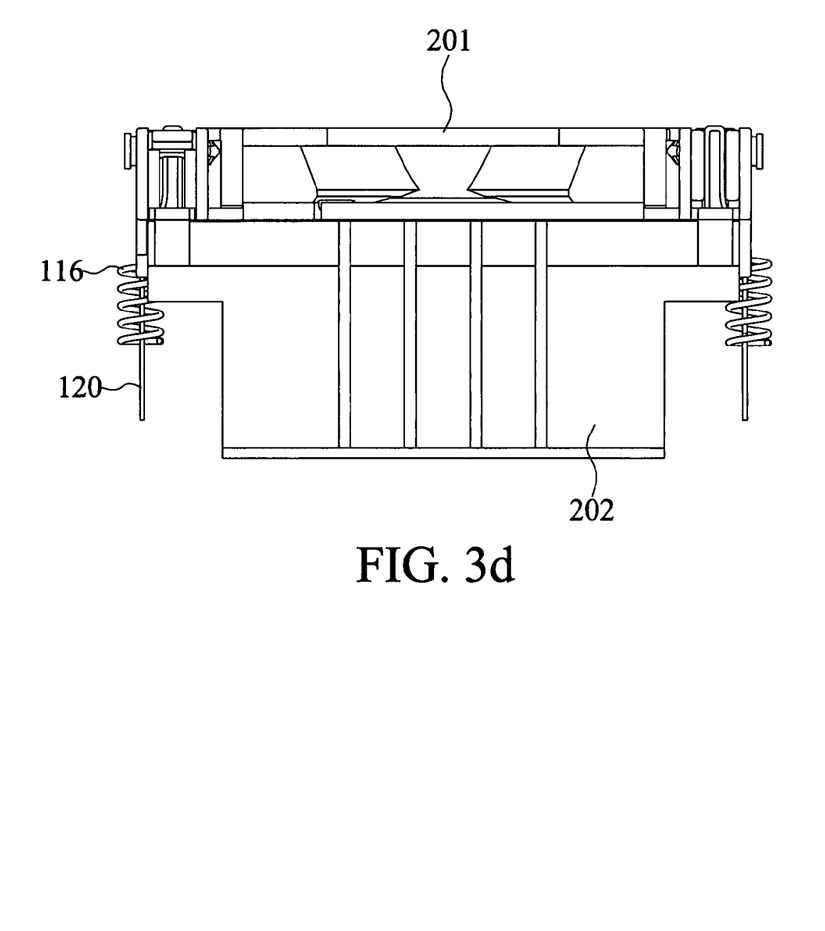
FIG. 3d is another schematic side view of the heat dissipating module of an embodiment of the invention.

As shown in FIG. 2, the engaging assembly 100 can be fixed to the frame 201 by means of the engaging device 110 thereof, forming a clamping device 200. Moreover, the engaging body 106 may be integrally formed with the frame 201, and the clamping device 200 is disposed on the heat sink 202. The engaging plates 115 engage heat sink 202, such that the clamping device 200 cannot slide. The base 203 used for accommodating a microprocessor, such as a CPU, comprises a plurality of engaging elements 204. The engaging assembly 100 is designed to completely match the base 203. Alternatively, the engaging assembly 100 can be designed to match a conventional heat sink or base.

Moreover, the engaging body 106 is not limited to having the two sides 107, 108, bottom surface 109, and extension 113. For example, the engaging body 106 may comprise three or four sides, or not an extension.

FIGS. 3a–3d are directed to assembly of the clamping device 200 (engaging assembly 100) and the heat sink 202. Specifically, the clamping device 200 is not limited to having two engaging assemblies 100. Namely, the clamping device 200 may comprise only one engaging assembly 100 or more engaging assemblies 100.

Figure 4A:
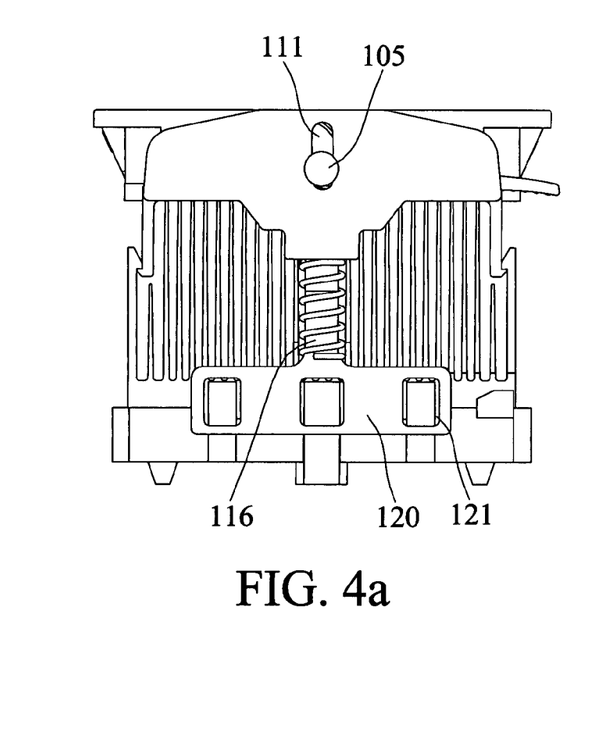
FIG. 4a is a schematic side view of the heat dissipating module of an embodiment of the invention, in which the resilient element is relaxed.
Figure 4B:
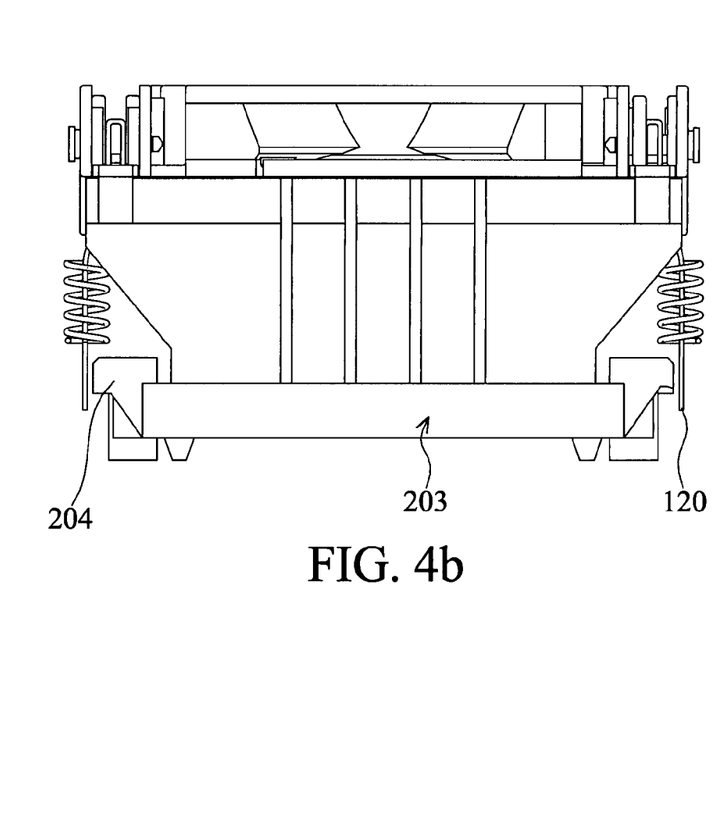
FIG. 4b is another schematic side view of the heat dissipating module of an embodiment of the invention, in which the resilient element is relaxed.
Figure 4C:
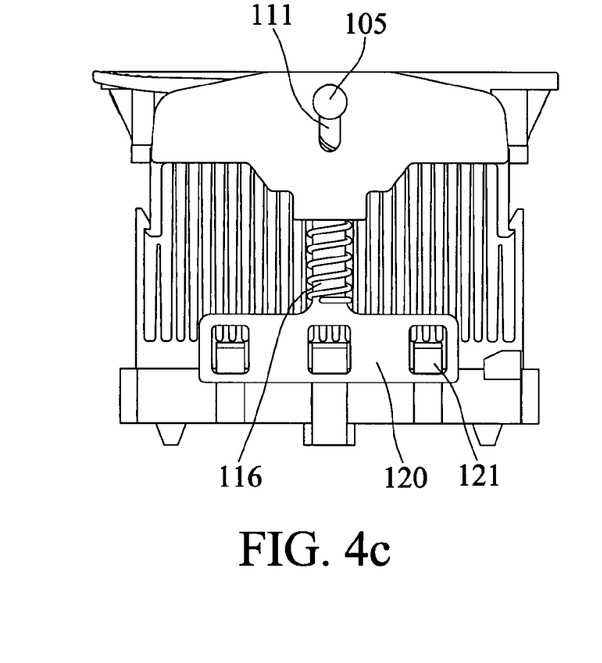
FIG. 4c is a schematic side view of the heat dissipating module of an embodiment of the invention, in which the resilient element is unrelaxed.
Figure 4D:
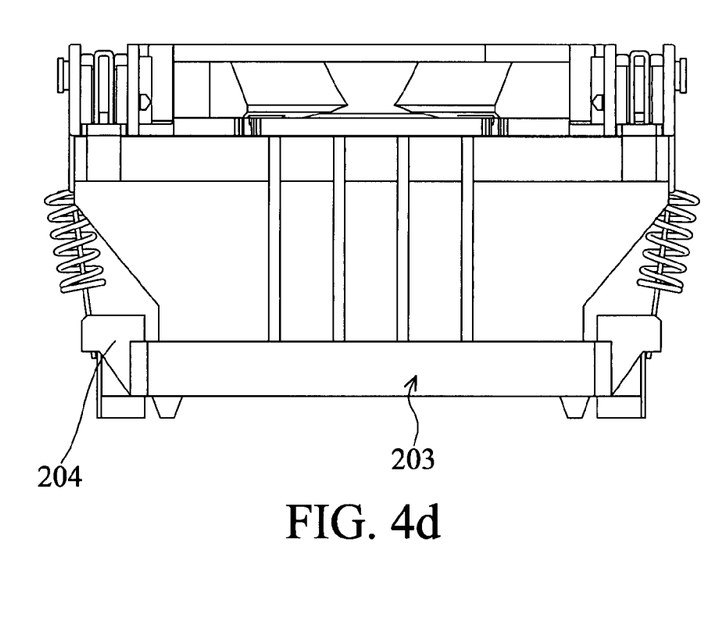
FIG. 4d is another schematic side view of the heat dissipating module of an embodiment of the invention, in which the resilient element is unrelaxed.

The following description is directed to operation of the clamping device 200 of this embodiment and refers to FIGS. 1a, 1b, 2, and 4a–4d. As shown in FIG. 4a, when the wrench bar 101 is rotated toward a first direction, the connecting element 105 is located in a lower position in the first pivot hole 111. At this point, the resilient element 116 is in a relaxed condition and the bottom engaging portion 120 of the tongue 117 does not engage the engaging elements 204 of the base 203, as shown in FIG. 4b. When the wrench bar 101 is rotated toward the other direction, contact points between the abutting portions 122 of the wrench bar 101 and the bottom surface 109 of the engaging body 106 continuously change along the curved surface 104 of each abutting portion 122. Specifically, the abutting portions 122 of the wrench bar 101 contact the bottom surface 109 of the engaging body 106 sequentially at points 131, 132, and 133. The contact points eventually fall between the planar surface 103 of each abutting portion 122 and the bottom surface 109. As the third pivot holes 102 are close to the curved surface 104 of the wrench bar 101, the connecting element 105 is gradually raised during movement of the contact points between the abutting portions 122 of the wrench bar 101 and the bottom surface 109 of the engaging body 106. As shown in FIG. 4c, the raised connecting element 105 forces the tongue 117 up. As the sloped surface 123 in the hollow portion 114 matches (or corresponds to) the bent portion 118, the raised bent portion 118 of the tongue 117 straightens and the resilient element 116 is thus in a compressed condition, as shown in FIG. 4d. At this point, the bottom engaging portion 120 engages the base 203 by the engaging holes 121 engaging the engaging elements 204.

Accordingly, the disclosed clamping device 200 (engaging assembly 100) can be applied to various conventional heat sinks and bases, thereby providing enhanced applicability. Further, assembly and disassembly of a heat sink and a fan can be easily achieved by simply turning the wrench bar 101 of the disclosed clamping device 200 (engaging assembly 100). Thus, assembly and disassembly of the heat sink and fan are convenient.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipating module, comprising:
    a frame for accommodating a fan; and
    an engaging assembly coupled to the frame and comprising:
        an engaging body comprising a hollow portion and at least one first pivot hole;
        a tongue comprising a bent portion and a bottom engaging portion, wherein the bent portion comprises at least one second pivot hole and is slidably engaged in the hollow portion;
        a resilient element fitting on the tongue and interposed between the engaging body and the bottom engaging portion of the tongue;
        a wrench bar abutting a surface of the engaging body and comprising at least one third pivot hole; and
        a connecting element fitting in the first, second, and third pivot holes and disposed in the engaging body for pivoting the tongue and the wrench bar to the engaging body.

2. The heat dissipating module as claimed in claim 1, wherein the engaging body further comprises at least one engaging plate by which the engaging body is fixed to a heat sink.

3. The heat dissipating module as claimed in claim 1, wherein the frame is integrally formed with the engaging body.

4. The heat dissipating module as claimed in claim 1, wherein the bottom engaging portion further comprises at least one engaging hole formed thereon.

5. The heat dissipating module as claimed in claim 1, wherein the caliber of the first pivot hole exceeds those of the second and third pivot holes.

6. The heat dissipating module as claimed in claim 1, wherein the hollow portion is formed by a plurality of sidewalls, and at least one sidewall thereof comprises a sloped surface.

7. The heat dissipating module as claimed in claim 1, wherein the wrench bar further comprises an abutting portion formed thereon.

8. The heat dissipating module as claimed in claim 1, wherein the resilient element comprises a spring.

9. A heat dissipating module, comprising:
    a frame for accommodating a fan;
    an engaging assembly coupled to the frame and comprising:

an engaging body comprising a hollow portion and at least one first pivot hole;

a tongue comprising a bent portion and a bottom engaging portion, wherein the bent portion comprises at least one second pivot hole and is slidably engaged in the hollow portion;

a resilient element fitting on the tongue and interposed between the engaging body and the bottom engaging portion of the tongue;

a wrench bar coupled to the engaging body and comprising at least one third pivot hole; and a connecting element fitting in the first, second, and third pivot holes and disposed in the engaging body for pivoting the tongue and the wrench bar to the engaging body, wherein the caliber of the first pivot hole exceeds that of the second and third pivot holes; and a base for accommodating a microprocessor and connected to the bottom engaging portion of the tongue.

10. The heat dissipating module as claimed in claim 9, wherein the engaging body further comprises at least one engaging plate by which the engaging body is fixed to a heat sink.

11. The heat dissipating module as claimed in claim 9, wherein the frame is integrally formed with the engaging body.

12. The heat dissipating module as claimed in claim 9, wherein the bottom engaging portion further comprises at least one engaging hole formed thereon.

13. The heat dissipating module as claimed in claim 9, wherein the hollow portion is formed by a plurality of sidewalls, and at least one sidewall thereof comprises a sloped surface.

14. The heat dissipating module as claimed in claim 9, wherein the base further comprises at least one engaging element engaging the bottom engaging portion.

15. The heat dissipating module as claimed in claim 9, wherein the wrench bar further comprises an abutting portion formed thereon.

16. The heat dissipating module as claimed in claim 9, wherein the resilient element comprises a spring.

17. An engaging assembly for a heat dissipating module, comprising:

an engaging body comprising a hollow portion and at least one first pivot hole;

a tongue comprising a bent portion and a bottom engaging portion, wherein the bent portion comprises at least one second pivot hole and is slidably engaged in the hollow portion;

a resilient element fitting on the tongue and interposed between the engaging body and the bottom engaging portion of the tongue;

a wrench bar abutting a surface of the engaging body and comprising at least one third pivot hole; and a connecting element fitting in the first, second, and third pivot holes and disposed in the engaging body, pivoting the tongue and the wrench bar to the engaging body.

18. The engaging assembly as claimed in claim 17, wherein the engaging body further comprises at least one engaging plate by which the engaging body is fixed to a heat sink.

19. The engaging assembly as claimed in claim 17, wherein the bottom engaging portion further comprises at least one engaging hole formed thereon.

20. The engaging assembly as claimed in claim 17, wherein the hollow portion is formed by a plurality of sidewalls, and at least one sidewall thereof comprises a sloped surface.

21. The engaging assembly as claimed in claim 17, wherein the wrench bar further comprises an abutting portion formed thereon.

22. The engaging assembly as claimed in claim 17, wherein the resilient element comprises a spring.

* * * * *